(12) United States Patent
Gopalakrishnan et al.

(10) Patent No.: US 9,651,624 B2
(45) Date of Patent: May 16, 2017

(54) SYSTEMS AND METHODS FOR STATE OF CHARGE ESTIMATION

(71) Applicant: QUALCOMM Incorporated, San Diego, CA (US)

(72) Inventors: Krishnakumar Gopalakrishnan, San Diego, CA (US); Eric I Mikuteit, San Diego, CA (US)

(*) Notice: Subject to any disclaimer, the term of this patent is extended or adjusted under 35 U.S.C. 154(b) by 922 days.

(21) Appl. No.: 13/800,366

(22) Filed: Mar. 13, 2013

(65) Prior Publication Data

US 2014/0172333 A1 Jun. 19, 2014

Related U.S. Application Data

(60) Provisional application No. 61/737,997, filed on Dec. 17, 2012.

(51) Int. Cl.
*G01R 31/36* (2006.01)

(52) U.S. Cl.
CPC ....... *G01R 31/3624* (2013.01); *G01R 31/362* (2013.01)

(58) Field of Classification Search
CPC .................................................. G01R 31/3624
USPC .......................................................... 702/63
See application file for complete search history.

(56) References Cited

U.S. PATENT DOCUMENTS

| | | | |
|---|---|---|---|
| 6,356,083 B1 | 3/2002 | Ying | |
| 6,522,900 B1 | 2/2003 | Cho | |
| 7,795,874 B1 | 9/2010 | Kirchev | |
| 8,046,181 B2 | 10/2011 | Kang et al. | |
| 2005/0231206 A1* | 10/2005 | Denning | G01R 31/3648 324/430 |
| 2006/0076929 A1 | 4/2006 | Tatsumi et al. | |
| 2008/0054850 A1 | 3/2008 | Tae et al. | |
| 2012/0268066 A1* | 10/2012 | Endo | B60K 6/365 320/109 |
| 2012/0274331 A1 | 11/2012 | Liu et al. | |

OTHER PUBLICATIONS

International Search Report and Written Opinion—PCT/US2013/075787—ISA/EPO—Apr. 17, 2014.
Hu Y., et al., "Model-Based Calibration for Battery Characterization in HEV Applications," American Control Conference, Jun. 11-13, 2008, pp. 318-325.
Windarko N.A., et al., "SOC Estimation Based on OCV for NiMH Batteries Using an Improved Takacs Model," Journal of Power Electronics, Mar. 2010, vol. 10 (2), pp. 181-186.

* cited by examiner

*Primary Examiner* — Bryan Bui (57) ABSTRACT

The present disclosure includes systems and methods for state of charge estimation. In one embodiment, the present disclosure includes a method comprising receiving a voltage corresponding to a state of charge of a battery, converting the voltage to an estimated state of charge using different algorithms across different ranges. In another embodiment, an offset state of charge is applied to a first state of charge to produce an estimated state of charge.

18 Claims, 7 Drawing Sheets

SYSTEMS AND METHODS FOR STATE OF CHARGE ESTIMATION

CROSS REFERENCE TO RELATED APPLICATIONS

The present disclosure claims priority to U.S. Provisional App. No. 61/737,997 filed Dec. 17, 2012, the content of which is incorporated herein by reference in its entirety for all purposes.

BACKGROUND

The present invention relates to systems and methods for state of charge estimation.

Unless otherwise indicated herein, the approaches described in this section are not prior art to the claims in this application and are not admitted to be prior art by inclusion in this section.

Many electronic systems receive power from batteries. Many electronic products provide users with information about the amount of charge (or remaining usable capacity) in their batteries. To provide this useful information to a user, it is often desirable to determine the state of charge of one or more batteries used to generate power for the electronic system. Some systems may measure the voltage on the battery and use the voltage to estimate the battery's state of charge ("SOC"). However, the relationship between battery voltage and state of charge is not always an accurate indicator of SOC especially under load conditions. Using battery voltage alone may result in large errors in estimating a battery's state of charge.

Some state of charge estimation techniques attempt to characterize (or profile) the relationship between battery voltage and state of charge and generate complex curves that describe that relationship. Such techniques may require significant computational power to implement and may be impractical to implement in many applications where processing power is limited.

The present invention provides improved systems and methods for state of charge estimation.

SUMMARY

The present disclosure includes systems and methods for state of charge estimation. In one embodiment, the present disclosure describes a method comprising receiving a voltage from a battery and converting the voltage to an estimated state of charge using a first algorithm when a state of charge of the battery is in a first range and converting the voltage to said estimated state of charge using a second algorithm when the state of charge of the battery is in a second range.

In one embodiment, converting the voltage to said estimated state of charge using the second algorithm comprises accessing a stored state of charge associated with the voltage, determining if the battery is in a charging state or a discharging state, and applying an offset state of charge to the stored state of charge when the battery is in one of the charging state or discharging state.

In one embodiment, when the battery is in a charging state, the second algorithm applies the offset state of charge to the stored state of charge, and when the battery is in a discharge state, the second algorithm does not apply the offset state of charge.

In one embodiment, when the battery is in a discharging state, the second algorithm applies the offset state of charge to the stored state of charge, and when the battery is in a charge state, the second algorithm does not apply the offset state of charge.

In one embodiment, converting the voltage to a state of charge using a first algorithm comprises accessing a stored state of charge associated with the voltage.

In one embodiment, said accessing comprises a table lookup.

In one embodiment, a method further comprises receiving a temperature from the battery, where the first range and the second range are different at different temperatures.

In one embodiment, a method further comprises determining a threshold using the temperature, wherein the first range comprises state of charge values below said threshold and the second range comprises state of charge values above said threshold.

In one embodiment, determining a threshold comprises a linear mapping from the temperature to said threshold.

In one embodiment, a method further comprises receiving a temperature of the battery, wherein the second algorithm comprises calculating an offset state of charge based on a temperature of the battery, a first estimated state of charge associated with the voltage, and a charging state.

In one embodiment, a method further comprises a third range, wherein the first range comprises state of charge values below a first threshold, the second range comprises state of charge values above the first threshold and below a second threshold, and the third range comprises state of charge values above the second threshold.

In one embodiment, a method further comprises converting the voltage from the battery to an estimated state of charge using the first algorithm when the state of charge of the battery is in the third range.

In one embodiment, the second algorithm comprises determining an offset state of charge using a model based on a first estimated state of charge.

In one embodiment, the model is further based on temperature.

In one embodiment, the model is a polynomial function of the estimated state of charge and temperature, and the second range is greater than a threshold state of charge.

In one embodiment, the second algorithm models a difference between a charge curve and a discharge curve across the second range using a polynomial.

In one embodiment, the voltage is an open circuit voltage of the battery.

In one embodiment, the second range begins at a first threshold SOC value, and wherein the second range increases as the temperature decreases.

In another embodiment, the present disclosure includes an electronic device comprising a battery, a voltage detection circuit to detect a voltage corresponding to a state of charge of the battery, and a processing circuit, the processing circuit configured to receive the voltage from the battery and convert the voltage to an estimated state of charge using a first algorithm when the state of charge of the battery is in a first range and converting the voltage to said estimated state of charge using a second algorithm when the state of charge of the battery is in a second range. Embodiments of electronic devices and/or integrated circuits may include aspects of the features described herein.

In another embodiment, the present disclosure includes a non-transitory computer readable storage medium having stored thereon computer software executable by a processor, the computer software embodying a method comprising receiving a voltage from a battery and converting the voltage to an estimated state of charge using a first algorithm when a state of charge of the battery is in a first range and converting the voltage to said estimated state of charge using a second algorithm when the state of charge of the battery is in a second range. Embodiments of executable software stored on such a computer readable medium may include aspects of the features described herein.

The following detailed description and accompanying drawings provide a better understanding of the nature and advantages of the present disclosure.

DETAILED DESCRIPTION

The present disclosure pertains to state of charge estimation. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
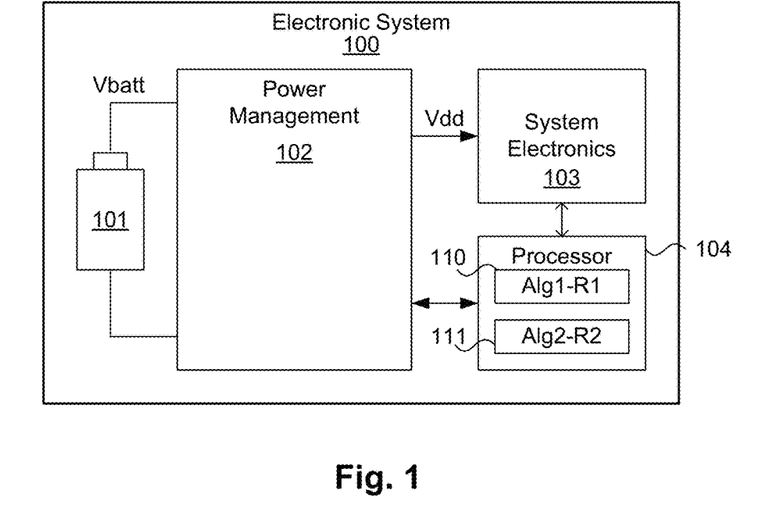
FIG. 1 illustrates an electronic system according to one embodiment.

FIG. 1 illustrates an electronic system 100 according to one embodiment. Features and advantages of the present invention include estimating a state of charge of a battery 101 with improved accuracy. In this example, battery 101 generates a battery voltage, Vbatt. Battery 101 may be a lithium ion (Li+) battery, for example. A power management circuit 102 may be configured between battery 101 and system electronics 103 to provide a power supply voltage, Vdd, to system electronics 103. Power management circuit 102 may sense the voltage on the battery, Vbatt, and a temperature of the battery, Tbatt, for example. Power management circuits implemented on an integrated circuit are sometimes referred to as "PMIC's" (i.e., power management integrated circuits), and may include a broad range of power management functionality. Power management circuit 102 may also provide the sensed battery voltage to a processor 104, which may be used to estimate the state of charge of battery 101. In certain embodiments, processor 104 may include instructions (e.g., executable code) for performing methods described below.

Figure 2:
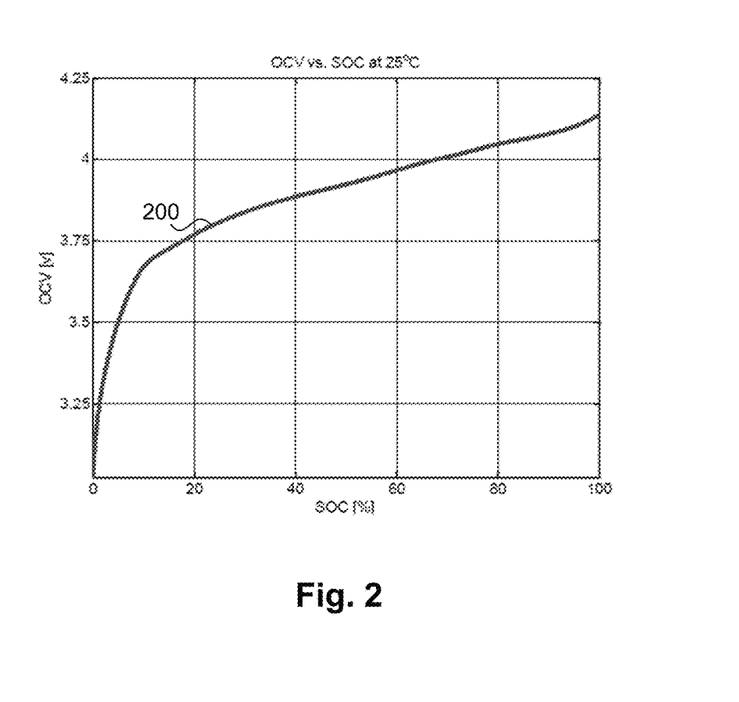
FIG. 2 illustrates a state of charge curve for a battery.

In one embodiment, processor 104 may receive a voltage from battery 101 and convert the voltage to an estimated state of charge. An advantage according to one embodiment includes using different state of charge algorithms over different ranges. For example, FIG. 2 illustrates a state of charge curve 200 for a lithium ion (Li+) battery. In FIG. 2, state of charge ("SOC") is plotted against an open circuit voltage ("OCV") of the battery. One challenge in estimating state of charge pertains to accurately modeling the relationship between voltage and SOC across the full range of voltages. Complex models may be required to accurately capture the voltage to SOC relationship across the full voltage range. Problematically, complex models typically consume large amounts of computational resources and may not lend themselves to lightweight devices with limited processing power or to applications that require fast results. In some embodiments, one algorithm (e.g., Alg1-R1) may be used to convert a voltage to an estimated state of charge when the state of charge of the battery is in a first range, and a second algorithm (e.g., Alg2-R2) may be used to convert a voltage to an estimated state of charge when the state of charge of the battery is in a second range. As illustrated by further examples below, using different algorithms over different ranges may allow the system to use simple, computationally efficient models to capture the relationship between battery parameters, such as voltage, and state of charge.

Figure 3:
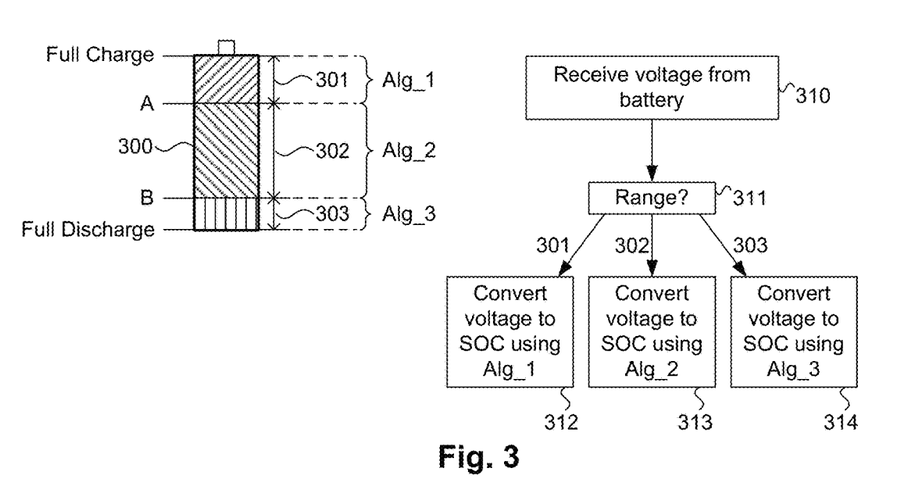
FIG. 3 illustrates estimating state of charge according to one embodiment.

FIG. 3 illustrates estimating state of charge according to one embodiment. Battery 300 may store different levels of charge during operation. This example shows three different state of charge ranges, including a first range 301 from full charge to charge level A, a second range 302 from charge level A to charge level B, and a third range 303 from charge level B to fully discharged. A process is illustrated at 310-314. At 310, a voltage from the battery is received (e.g., by a processor). At 311, the range is determined. For example, in one implementation the range may be determined by converting the open circuit voltage on the battery to an initial state of charge estimate. If the battery is in range 301, then the voltage is converted to an estimated SOC using a first algorithm (Alg_1) at 312. If the battery is in range 302, then the voltage is converted to an estimated SOC using a second algorithm (Alg_2) at 313. If the battery is in range 303, then the voltage is converted to an estimated SOC using a third algorithm (Alg_3) at 314. It is to be understood that other range partitions may be used in various embodiments.

Another problem with determining state of charge is that up to 20-30% of SOC error occurs when charging into the flat portion of curve 200 of FIG. 2. Further, typical battery characterization profiles use discharge open circuit voltage (OCV) curves and may not take into account charging OCV curves. Discharge curves, for example, may be based on relations between OCV values and SOC values that were observed while a battery was discharging (e.g., at very low C-rates). Likewise, charge curves may be based on relations between OCV values and SOC values that were observed while a battery was charging (e.g., at very low C-rates). Accordingly, the relationships between OCV and SOC values may be different when the battery is charging or discharging. As illustrated below, OCV values may be mapped to SOC values using a lookup table, but the OCV-SOC relationships may apply only when the battery is discharging. Thus, SOC error may be due to charge OCV curves not matching discharge OCV curves.

Figure 4:
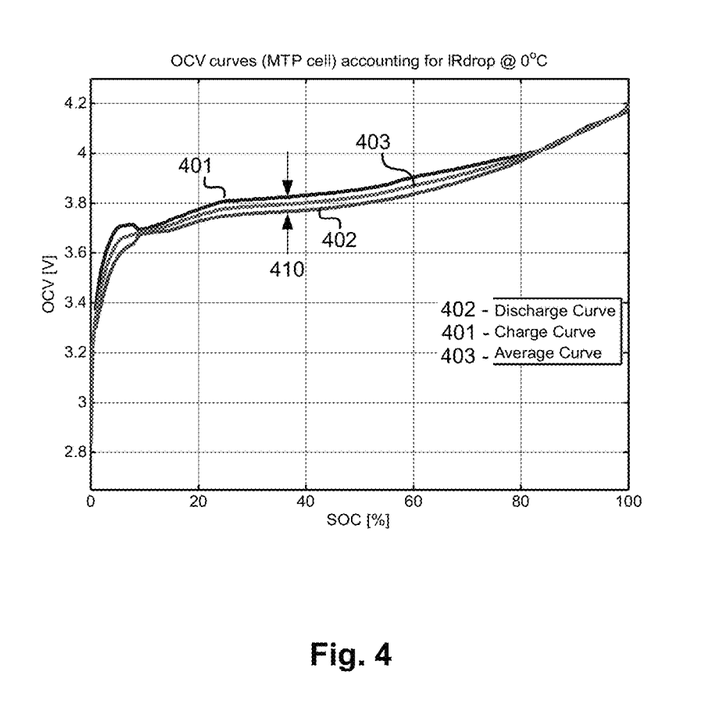
FIG. 4 illustrates charging and discharging SOC v. OCV curves.

FIG. 4 illustrates charging and discharging SOC v. OCV curves. Embodiments of the present disclosure may identify and compensate for a relaxation voltage between charging and discharging of the battery cell. FIG. 4 illustrates a discharge curve 402 (bottom curve), charge curve 401 (top curve), and average curve 403. The discharge curve 402 establishes relations between OCV values and SOC values when the battery is discharging. The charge curve 401 establishes relations between OCV values and SOC values when the battery is charging. The OCV difference between the discharge and charge curves is referred to as the relaxation voltage 410. Thus, for every SOC value, there are two possible stable relaxation cell voltages, depending on whether the cell is charging or discharging. Ignoring the relaxation voltage loop magnitude may lead to very large SOC prediction errors, especially in the flat portion of the curves.

Figure 5:
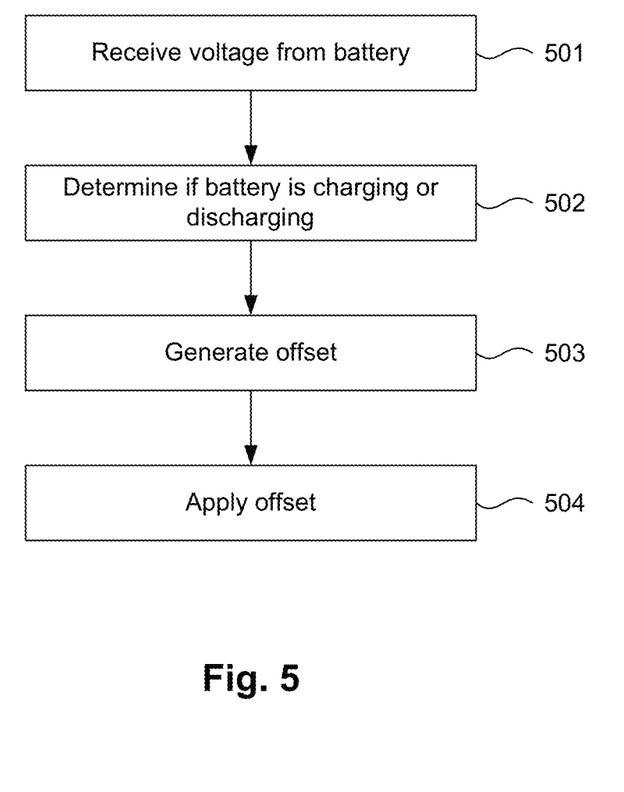
FIG. 5 illustrates a method for estimating state of charge according to another embodiment.

FIG. 5 illustrates a method for estimating state of charge according to another embodiment. At 501, a voltage is received from the battery. In one embodiment, the voltage may be an open circuit voltage. At 502, the system determines if the battery is in a charging state or a discharging state. At 503, the system may generate an offset to compensate for the relaxation voltage. Certain embodiments may include the offset to correct for the state of charge difference between charge and discharge curves, for example. At 504, the offset is applied when the battery is in one of the charging state or discharging state. For example, if the battery is in a charging state, and if an initial SOC is generated from the OCV using a discharge curve, then the offset may be applied to the initial SOC to account for the relaxation voltage. Similarly, if the battery is in a discharging state, and if an initial SOC is generated from the OCV using a charge curve, then the offset may be applied to the initial SOC.

Figure 6:
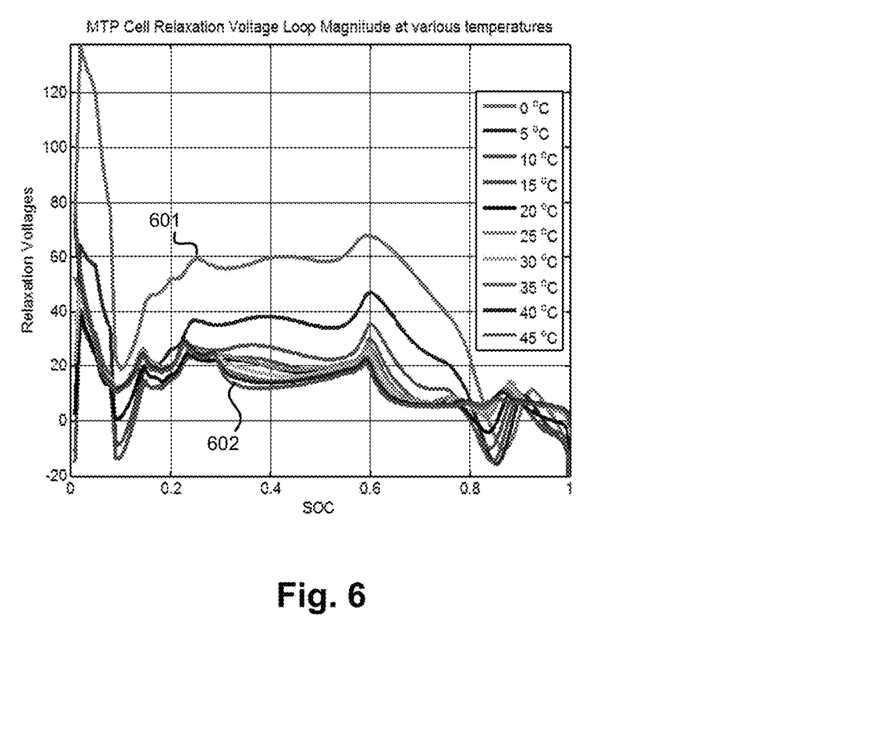
FIG. 6 illustrates relaxation voltage at various temperatures.

FIG. 6 illustrates relaxation voltage at various temperatures. From FIG. 6 it can be seen that the relaxation voltage magnitude reduces as temperature increases. For instance, the highest relaxation voltage occurs at 0° C. as shown at 601. The lowest relaxation voltage occurs at 45° C. as shown at 602. In this example, the relaxation voltage has a value not lower than about 15 mV, which certain implementations may not ignore. It should also be noted that below a certain value (e.g., SOC about 0.1) and above a certain value (e.g., SOC about 0.8) that other correctable measurement errors overtake the measurements shown. Further, FIG. 6 illustrates that the relaxation voltage generally follows what is sometimes referred to as a "bathtub" curve, wherein the error is close to zero for low and high SOC values and increases over an intermediate range (e.g., 0.1-0.8).

Figure 7:
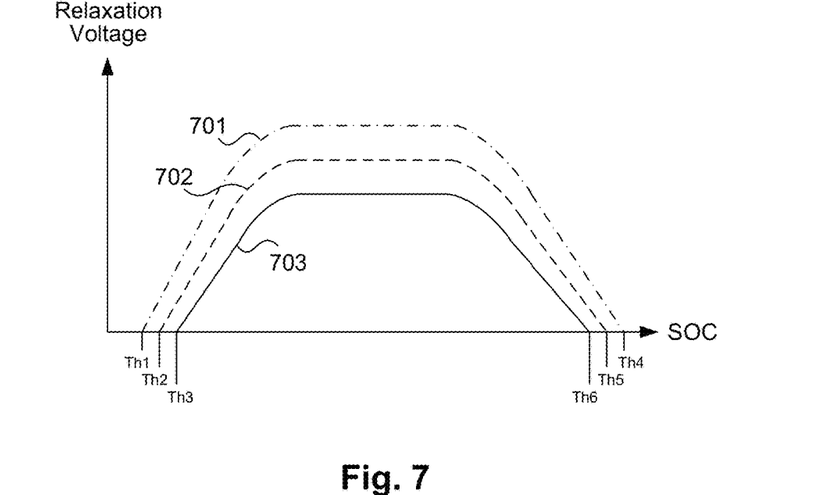
FIG. 7 illustrates a characteristic OCV v. SOC relaxation voltage curve at different temperatures.

FIG. 7 more clearly illustrates a characteristic OCV v. SOC relaxation voltage curve at different temperatures. Curve 701 shows a relaxation voltage curve for a first temperature, curve 702 shows a relaxation voltage curve for a second temperature lower than the first temperature, and curve 703 shows a relaxation voltage curve for a third temperature lower than the second temperature. Curves 701-703 illustrate that different temperatures may result in both different relaxation voltages and different ranges. In certain embodiments, an SOC estimation algorithm used for an intermediate range may be different than an SOC algorithm used across ranges at terminal SOC points (i.e., fully charged and fully discharged), and the intermediate range may increase as temperature increases. For example, the relaxation voltage of curve 701 has approximately zero relaxation voltage below a first threshold Th1 and above a second threshold Th4. However, between these thresholds the relaxation voltage is non-negligible. Similarly, the relaxation voltage of curve 702 has approximately zero relaxation voltage below a first threshold Th2 and above a second threshold Th5, and the relaxation voltage of curve 703 has approximately zero relaxation voltage below a first threshold Th3 and above a second threshold Th6. Curves 701-703 illustrated that SOC estimation may occur over different ranges across different temperatures. For example, SOC estimation may not include relaxation voltage compensation in a first range starting from zero SOC to a first threshold Th1. SOC estimation may include relaxation voltage compensation in a second range above Th1 and below a second threshold Th4. Finally, SOC estimation may not include relaxation voltage compensation in a third range above Th4, for example. However, the ranges and/or thresholds may change over temperature. For instance, at a different temperature corresponding to curve 703, SOC estimation may not include relaxation voltage compensation in a first range starting from zero SOC to a first threshold Th3. SOC estimation may include relaxation voltage compensation in a second range above Th3 and below a second threshold Th6. No relaxation voltage compensation may be included in a third range above Th6.

Curves 701-703 illustrate that the thresholds may change over temperature. In one embodiment, a threshold may be calculated and used to determine whether or not an offset is applied to compensate for differences between a charge curve and a discharge curve. For example, in one embodiment, the threshold is calculated using a linear mapping from temperature to a threshold. Accordingly, certain embodiments may adjust the lower and/or upper thresholds linearly over temperature so that the ranges change automatically as temperature changes. For example, the system may receive a temperature and use the temperature to determine a range and corresponding algorithm to use to determine SOC. In particular, a temperature may be used to determine a threshold using a linear function as follows. One example linear model may use two relaxation value—temperature pairs—e.g., (SOC,T)=(8%, 0° C.) and (18%, 45° C.), where relaxation is expressed as a state of charge. A threshold may be determined using the following simple linear relation:

$$Y=mx+b,$$

where y is relaxation expressed as a percentage of SOC, x is temperature, b is the y-intercept equal to 8%, and m is the slope calculated as follows:

$$\text{Slope}=(18\%-8\%)/(45-0).$$

Accordingly, for any temperature, a corresponding SOC threshold value may be determined for that temperature. In one embodiment, SOC estimations made when an initial SOC is above the SOC threshold may use one algorithm, and SOC estimations made when an initial SOC is below the SOC threshold may use a different algorithm. A similar approach may be used for determining a second threshold defining an upper bound of a range (e.g., thresholds Th4-Th6) at different temperatures.

Figure 8:
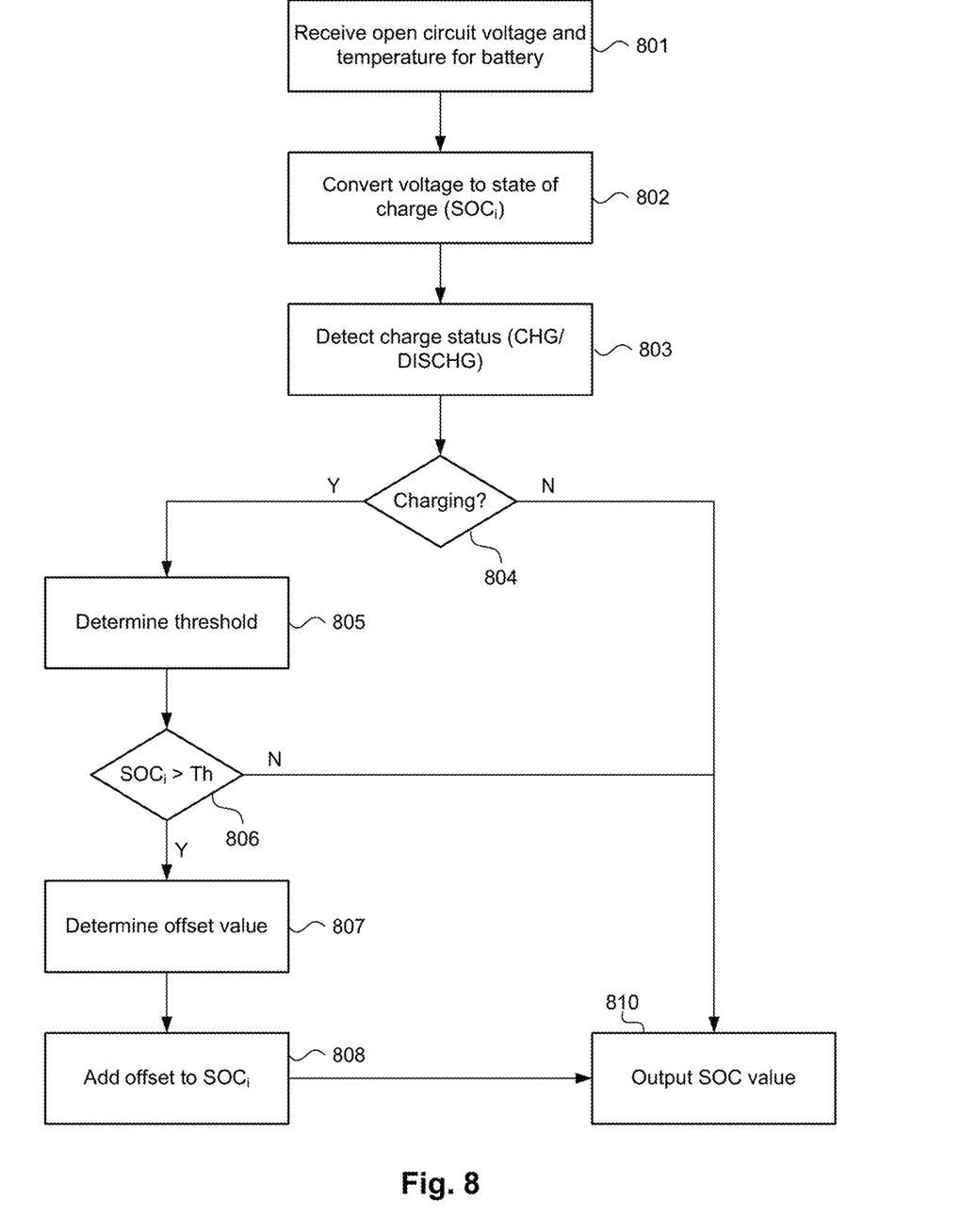
FIG. 8 illustrates an example method of estimating state of charge according to one embodiment.

FIG. 8 illustrates an example method of estimating state of charge according to one embodiment. In this example, a system may receive an open circuit voltage from a battery and a battery temperature at 801. For example, a PMIC (as illustrated in FIG. 1) may include circuitry for sensing the open circuit battery voltage and battery temperature, and digital values of the voltage and temperature may be provided to a processing circuit. At 802, the voltage is converted to an initial state of charge (SOCi). In one embodiment, a lookup table that associates open circuit voltages with corresponding states of charge may be used. The lookup table may comprise an a priori open circuit voltage versus SOC profile. In this example, the states of charge associated with the open circuit voltages are for a discharge curve. Accordingly, the state of charge values are related to the open circuit voltage values when a battery is discharging. At 803, the system may detect whether the battery is in a charging state or in a discharging state. In this example, if the battery is in a discharging state at 804 (Charging=No), then the system may output the initial SOC value at 810. However, if the battery is in a charging state at 804 (Charging=Yes), then the system may compensate for a difference between charging and discharging curves. At 805, a threshold is determined. The threshold may be calculated by applying the temperature measurement to a linear model as described above, for example. Other embodiments may relate temperature and threshold in other ways. In this example, the threshold is expressed as an SOC value. Therefore, at 806, the initial SOC (SOCi) generated from the open circuit voltage above is compared to the threshold. If the initial SOC is less than the threshold, Th, which corresponds to a range of SOC values where the relaxation voltage is small, then the system may output the initial SOC value at 810. However, if the initial SOC is greater than the threshold, Th, which corresponds to a range of SOC values where the relaxation voltage is larger, then the system may determine an offset value at 807. An example calculation of an offset is provided below using a polynomial function of the initial SOC and temperature. Those skilled in the art will appreciate that the threshold defines a boundary between ranges of SOC values. Over a lower range, no correction is used in this example. Correction may be applied over a higher range where a relaxation voltage is larger, using a polynomial. The order of the polynomial is reduced, thereby increasing computational efficiency, because it is only modeling a portion of the entire range of SOC values. At 808, the offset is added to the initial SOC value, and the final SOC value is output at 810.

In one embodiment the system may use temperature and initial state of charge to determine an offset. The following is an example model for calculating an offset:

$$f(x,y) = p00 + p10*x + p01*y + p20*x^2 + p11*x*y +$$
$$p02*y^2 + p30*x^3 + p21*x^2*y + p12*x*y^2 +$$
$$p03*y^3 + p40*x^4 + p31*x^3*y + p22*x^2*y^2 +$$
$$p13*x*y^3 + p04*y^4 + p50*x^5 + p41*x^4*y +$$
$$p32*x^3*y^2 + p23*x^2*y^3 + p14*x*y^4 + p05*y^5$$

In this example, x is normalized by mean 22.5 and std 14.37 and y is normalized by mean 0.465 and std 0.1949. The following are goodness of fit metrics for one example embodiment: R-square: 0.9657, Adjusted R-square: 0.9652, RMSE: 1.838. Once the offset is determined, it may be applied to the initial SOC value to determine a more accurate SOC value. Coefficients for polynomials according to different embodiments may be generated using characteristic date from batteries to be used in an application. Charge and discharge curves for multiple temperatures may be acquired. Polynomials fitting ranges of the curves or relaxation voltages may be generated using a variety of constraints, including maximum order of the polynomial, goodness of fit, or other metrics. It is to be understood that a variety of models and approaches may be used to determine an offset to meet a variety of design goals of which the above is just one example. Advantageously, if the model is used for a range that is less than the full range, then simpler computationally efficient models may be used. For instance, across the full range of SOC values, a 10+ order polynomial may be required, which is computationally very complex. However, by reducing the range, modeling may be simplified to a 5th or even a 4th order polynomial, for example.

Figure 9:
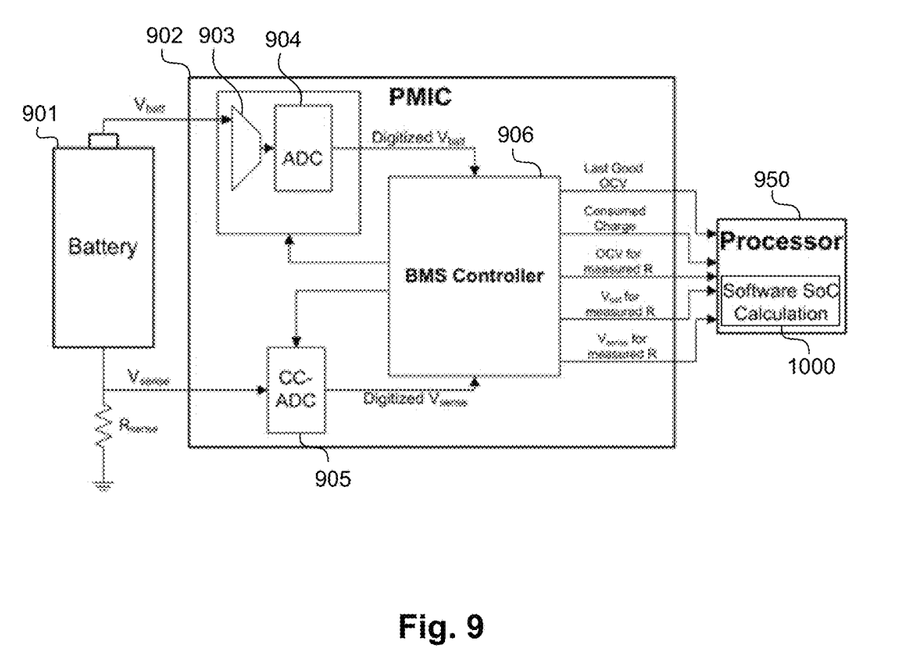
FIG. 9 illustrates another example configuration according to one embodiment.

FIG. 9 illustrates another example configuration according to one embodiment. The embodiment shown in FIG. 9 includes a Li+ battery 901, power management integrated circuit (PMIC) 902, and processor 950. One terminal of battery 901 having an open circuit voltage Vbatt is coupled to an analog-to-digital converter (ADC) 904 through multiplexer (MUX) 903 in PMIC 902. ADC 904 may receive other voltages (not shown) from other parts of the system via MUX 903, for example. A digitized battery voltage is provided from ADC 904 to a battery management system (BMS) controller 906. A second terminal of battery 901 is coupled to ground through a sense resistor, Rsense. A voltage, Vsense, may be used to sense the current (i.e., the charge) through Rsense. A coulomb counter (CC) ADC 905 may provide a digitized value of Vsense to BMS controller 906. BMS controller 906 may provide a last good open circuit voltage (OCV), consumed charge, OCV for measured resistance, Vbatt for measured resistance, and Vsense for measured resistance to processor 950. Processor 950 may include instructions (e.g., executable code) for performing the techniques described herein as well as other functions. In this particular example, processor 950 includes instructions for performing an algorithm 1000, including software for state of charge calculations.

Figure 10:
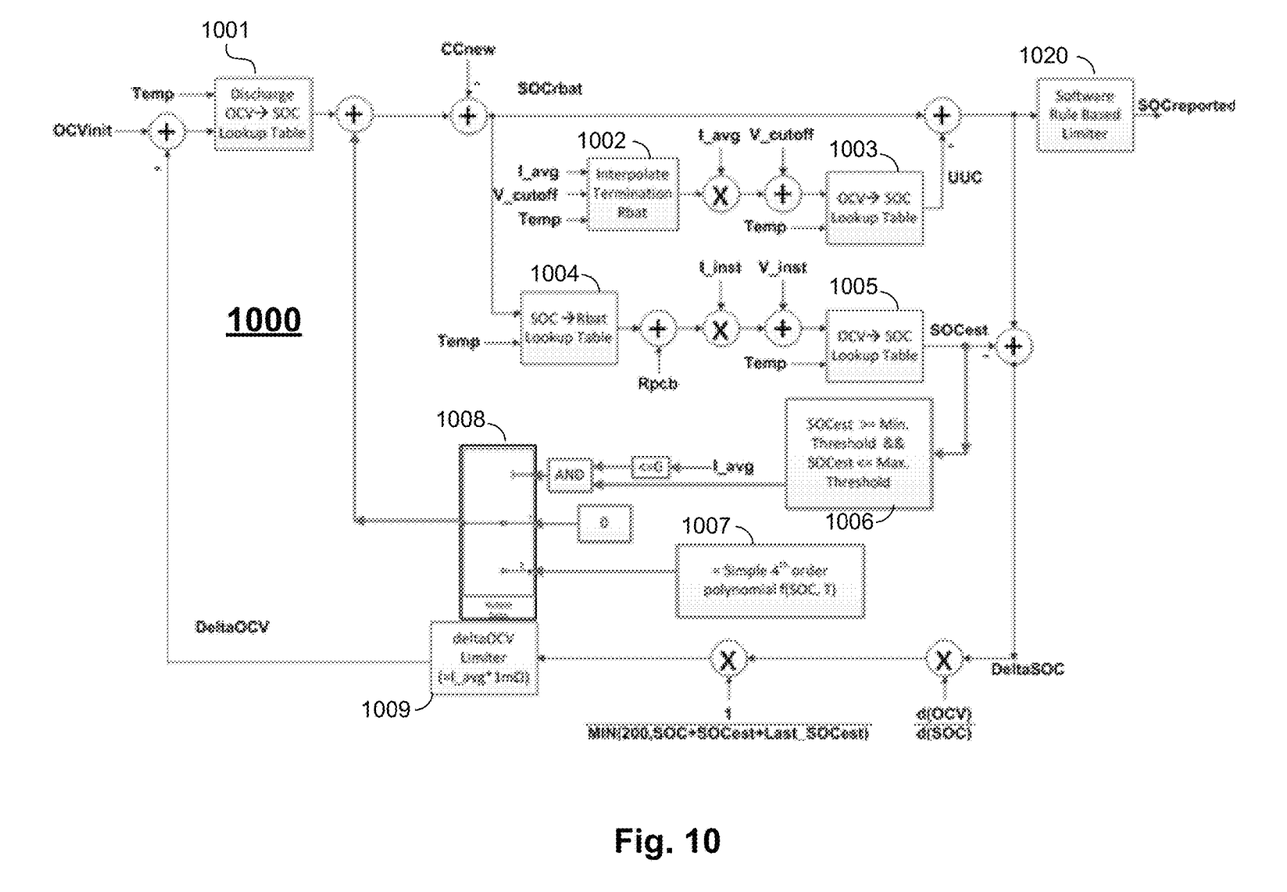
FIG. 10 illustrates another example algorithm for estimating state of charge according to one embodiment.

FIG. 10 illustrates an example algorithm 1000 for estimating state of charge according to one embodiment. In this example implementation, features described above are incorporated into a state of charge estimation algorithm 1000. The process is illustrated using block diagrams, but those skilled in the art will recognize that the process may be implemented as executable code, for example. The algorithm receives OCVinit and Temp, which are the open circuit voltage (OCV) and temperature of the battery. A value DeltaOCV, described below, is subtracted from OCVinit, and the resulting value and Temp are provided to lookup table 1001 that associates OCV and SOC values at different temperatures.

The SOC result from lookup table 1001 is added to a value produced by section 1008, which provides either a zero (0) value or a value derived from a $4^{th}$ order polynomial f(SOC, T) as illustrated at 1007. The polynomial may use the SOC produced by the lookup table and Temp, for example. Section 1008 is illustrated as a multiplexer, where the output is controlled by the values of average filtered battery current, I_ave, and a state of charge at 1006. As mentioned above, the system may determine if the battery is in a charging state or discharging state. This step is illustrated here as determining if I_ave is less than or equal to zero (e.g., signum function, I_ave <=0). I_ave less than zero means the battery is charging. Additionally, the system may determine if the state of charge is within a range (e.g., min threshold<=SOC<=max threshold) at 1006. In this example, the initial SOC used for determining the range is based on a previous measurement corrected for battery resistance (namely, SOCest). For instance, a previous SOC value, SOCrbat may be used to determine an embedded battery resistance Rbat using lookup table 1004, which holds embedded resistance values for different SOC levels. Rbat is added to printed circuit board resistance Rpcb, multiplied by an instantaneous current, I_inst, and added to an instantaneous voltage, V_inst, to produce an OCV value. The OCV value and temperature may be used to generate an estimated SOC, SOCest, which is used to select the range at 1006, for example. If I_ave is less than or equal to zero (e.g., charging state) and SOCest is within the range defined at 1006, then a value generated by a $4^{th}$ order polynomial is added to the initial SOC value from lookup table 1001. If the I_ave is greater than zero (e.g., discharging state) or if SOCest is outside the range defined at 1006 (e.g., outside an intermediate range where the relaxation voltage is negligible), then zero (0) is added to the initial SOC from look up table 1001.

In this example, the resulting SOC value, which is corrected for relaxation voltage, is further processed before reporting to a user. A coulomb counter value, CCnew, reduces the SOC value when the system draws current from the battery, for example. Further, the example algorithm 1000 includes subtracting off an unusable charge (UUC) based on a cutoff voltage, V_cutoff. An embedded resistance, Rbat is generated at 1002 and multiplied by average current, I_ave. The IR drop is used to compensate Vcutoff, and the resulting OCV value is converted to an SOC value using lookup table 1003. The SOC value represents an unusable amount of charge, which may be subtracted off before the final SOC is reported to a user. A software rule based limiter 1020 is used at the output to control the range of values reported to a user. Limiter 1020 filters the output and prevents sudden jumps (step changes) in reported SOC, for example. Further, the present algorithm generates a deltaSOC value based on SOCest. First, d(OCV)/d(SOC) is the rate of change of OCV for a given change in SOC. One advantageous formula that can be used to limit the rate is the min ( ) formula. $\frac{1}{200}$ is the highest possible value that can come out this block. This multiplies the per SOC change output to produce a limited OCV update. Accordingly, at any given moment, the system may add only a maximum possible value for the OCV every time the algorithm is updated. If the OCV correction is less than this, then the limiter circuit doesn't matter, and may be ignored.

Embodiments of the present invention may be useful in a variety of battery operated systems. One example application is a mobile phone. Referring again to FIG. 1, software for performing some or all of the various techniques described above may be loaded into processor 104. Processor 104 may be coupled to a memory (e.g., volatile or non-volatile memory) for receiving the instructions and may include internal memory for storing some or all of the instructions. A non-transitory computer readable medium may store instructions for performing the methods described herein. The instructions may be loaded into a processor, for example, to configure processor to perform the techniques described herein.

The above description illustrates various embodiments of the present invention along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A method comprising:
    receiving a voltage from a battery;
    converting the voltage to a first state of charge; and
    converting the voltage to an estimated state of charge using a first algorithm when the first state of charge of the battery is in a first range and converting the voltage to said estimated state of charge using a second algorithm when the first state of charge of the battery is in a second range,
    wherein converting the voltage to said estimated state of charge using the second algorithm comprises:
    accessing a stored state of charge associated with the voltage;
    determining if the battery is in a charging state or a discharging state; and
    applying an offset state of charge to the stored state of charge when the battery is in one of the charging state or discharging state to produce said estimated state of charge.

2. The method of claim 1 wherein, when the battery is in a charging state, the second algorithm applies the offset state of charge to the stored state of charge, and when the battery is in a discharge state, the second algorithm does not apply the offset state of charge.

3. The method of claim 1 wherein, when the battery is in a discharging state, the second algorithm applies the offset state of charge to the stored state of charge, and when the battery is in a charge state, the second algorithm does not apply the offset state of charge.

4. The method of claim 1 wherein said accessing comprises a table lookup.

5. The method of claim 1 further comprising receiving a temperature from the battery, wherein the first range and the second range are different at different temperatures.

6. The method of claim 1 further comprising receiving a temperature of the battery, wherein the second algorithm further comprises calculating the offset state of charge based on a temperature of the battery, a second state of charge, and a charging state.

7. The method of claim 1 wherein the second algorithm further comprises determining the offset state of charge using a model based on a second state of charge.

8. The method of claim 7 wherein the model is further based on temperature.

9. The method of claim 1 wherein the second algorithm models a difference between a charge curve and a discharge curve across the second range using a polynomial.

10. The method of claim 1 wherein the voltage is an open circuit voltage of the battery.

11. The method of claim 1 wherein the second range begins at a first threshold SOC value, and wherein the second range increases as the temperature increases.

12. A method comprising:
    receiving a voltage from a battery;
    converting the voltage to a first state of charge;
    receiving a temperature from the battery;
    determining a threshold using the temperature; and
    converting the voltage to an estimated state of charge using a first algorithm when the first state of charge of the battery is in a first range and converting the voltage to said estimated state of charge using a second algorithm when the first state of charge of the battery is in a second range,
    wherein the first range and the second range are different at different temperatures, wherein the first range comprises state of charge values below said threshold and the second range comprises state of charge values above said threshold.

13. The method of claim 12 wherein said determining comprises a linear mapping from the temperature to said threshold.

14. A method comprising:
    receiving a voltage from a battery;
    converting the voltage to a first state of charge; and
    converting the voltage to an estimated state of charge using a first algorithm when the first state of charge of the battery is in a first range and converting the voltage to said estimated state of charge using a second algorithm when the first state of charge of the battery is in a second range, wherein the first range comprises state of charge values below a first threshold, the second range comprises state of charge values above the first threshold and below a second threshold, and a third range comprises state of charge values above the second threshold.

15. The method of claim 14 further comprising converting the voltage from the battery to said estimated state of charge using the first algorithm when the state of charge of the battery is in the third range.

16. A method comprising:
receiving a voltage from a battery;
converting the voltage to a first state of charge; and
converting the voltage to an estimated state of charge using a first algorithm when the first state of charge of the battery is in a first range and converting the voltage to said estimated state of charge using a second algorithm when the first state of charge of the battery is in a second range,
wherein the second algorithm comprises determining an offset state of charge using a model based on a second state of charge,
wherein the model is further based on temperature, and
wherein the model is a polynomial function of the second state of charge and temperature, and wherein the second range is greater than a threshold state of charge.

17. An electronic device comprising:
a battery;
a voltage detection circuit to detect a voltage corresponding to a state of charge of the battery; and
a processing circuit, the processing circuit configured to receive the voltage from the battery, convert the voltage to a first state of charge, and convert the voltage to an estimated state of charge using a first algorithm when the first state of charge of the battery is in a first range and convert the voltage to said estimated state of charge using a second algorithm when the first state of charge of the battery is in a second range,
wherein converting the voltage to said estimated state of charge using the second algorithm comprises:
accessing a stored state of charge associated with the voltage;
determining if the battery is in a charging state or a discharging state; and
applying an offset state of charge to the stored state of charge when the battery is in one of the charging state or discharging state to produce said estimated state of charge.

18. A non-transitory computer readable storage medium having stored thereon computer software executable by a processor, the computer software embodying a method comprising:
receiving a voltage from a battery;
converting the voltage to a first state of charge; and
converting the voltage to an estimated state of charge using a first algorithm when the first state of charge of the battery is in a first range and converting the voltage to said estimated state of charge using a second algorithm when the first state of charge of the battery is in a second range,
wherein converting the voltage to said estimated state of charge using the second algorithm comprises:
accessing a stored state of charge associated with the voltage;
determining if the battery is in a charging state or a discharging state; and
applying an offset state of charge to the stored state of charge when the battery is in one of the charging state or discharging state to produce said estimated state of charge.

* * * * *